(12) United States Patent
Ohta et al.

(10) Patent No.: US 8,633,543 B2
(45) Date of Patent: Jan. 21, 2014

(54) ELECTRO-STATIC DISCHARGE PROTECTION CIRCUIT AND SEMICONDUCTOR DEVICE

(75) Inventors: Kazutoshi Ohta, Yokohama (JP); Kenji Hashimoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/038,910

(22) Filed: Mar. 2, 2011

(65) Prior Publication Data

US 2011/0227127 A1    Sep. 22, 2011

(30) Foreign Application Priority Data

Mar. 19, 2010   (JP) .................... 2010-064979

(51) Int. Cl.
*H01L 27/02*    (2006.01)

(52) U.S. Cl.
USPC ........... 257/355; 257/170; 257/127; 257/173; 257/174; 257/360; 257/409; 257/452; 257/484; 257/490; 257/605; 361/56

(58) Field of Classification Search
USPC ............. 327/321; 361/111, 56; 257/133, 170, 257/127, 355, 360, 409, 452, 484, 490, 494, 257/495, 605
See application file for complete search history.

(56) References Cited

U.S. PATENT DOCUMENTS

| | | | | |
|---|---|---|---|---|
| 4,063,115 A | * | 12/1977 | Okuhara et al. | 327/381 |
| 4,084,110 A | * | 4/1978 | Okuhara et al. | 327/381 |
| 4,794,441 A | * | 12/1988 | Sugawara et al. | 257/124 |
| 5,012,317 A | * | 4/1991 | Rountre | 257/173 |
| 5,164,874 A | * | 11/1992 | Okano et al. | 361/56 |
| 5,682,047 A | * | 10/1997 | Consiglio et al. | 257/335 |
| 5,719,733 A | * | 2/1998 | Wei et al. | 361/56 |
| 5,754,381 A | * | 5/1998 | Ker | 361/56 |
| 5,798,520 A | * | 8/1998 | Kuijk et al. | 250/214 A |
| 5,905,288 A | * | 5/1999 | Ker | 257/355 |
| 6,215,135 B1 | | 4/2001 | Schröder | |
| 6,304,127 B1 | * | 10/2001 | Lin | 327/321 |
| 6,429,505 B1 | * | 8/2002 | Kunikiyo | 257/577 |
| 6,978,008 B2 | * | 12/2005 | Nakamura | 379/382 |
| 2002/0122280 A1 | * | 9/2002 | Ker et al. | 361/56 |
| 2003/0218841 A1 | * | 11/2003 | Kodama | 361/56 |
| 2004/0027744 A1 | * | 2/2004 | Liu et al. | 361/56 |
| 2010/0295094 A1 | * | 11/2010 | Albers et al. | 257/173 |
| 2011/0207409 A1 | * | 8/2011 | Ker et al. | 455/63.1 |

FOREIGN PATENT DOCUMENTS

| | | |
|---|---|---|
| JP | 2002-522906 A | 7/2002 |
| JP | 2005-101386 A | 4/2005 |

* cited by examiner

*Primary Examiner* — Zandra Smith
*Assistant Examiner* — Tsz Chiu
(74) *Attorney, Agent, or Firm* — Arent Fox LLP (57) ABSTRACT

An electro-static discharge protection circuit includes: a PNPN junction, a P-type side of the PNPN junction being coupled to a terminal, an N-type side of the PNPN junction being coupled to ground; and a P-type metal oxide semiconductor transistor, a source and a gate of the P-type metal oxide semiconductor transistor being coupled to an N-type side of a PN junction whose P-type side coupled to the ground, and a drain of the P-type metal oxide semiconductor transistor being coupled to the terminal.

16 Claims, 13 Drawing Sheets

ELECTRO-STATIC DISCHARGE PROTECTION CIRCUIT AND SEMICONDUCTOR DEVICE

CROSS-REFERENCE TO RELATED APPLICATIONS

This application claims the benefit of priority from Japanese Patent Application No. 2010-64979 filed on Mar. 19, 2010, the entire contents of which are incorporated herein by reference.

BACKGROUND

1. Field

Aspects discussed herein relate to an electro-static discharge protection circuit.

2. Description of Related Art

In order to prevent damage caused by electro static discharge, an electro-static discharge (ESD) protection circuit is provided in a chip, e.g., in an input and output unit of an integrated circuit (IC) having a metal oxide semiconductor (MOS) structure. When a positive or negative high voltage is applied to a terminal of the chip, the ESD protection circuit includes a path which becomes conductive to release charge into a power supply line or a ground line.

The related art is disclosed in Japanese Laid-open Patent Publication No. 2005-101386, Japanese Laid-open Patent Publication No. 2002-522906, or the like.

SUMMARY

An electro-static discharge protection circuit includes a PNPN junction, a P-type side of the PNPN junction being coupled to a terminal, an N-type side of the PNPN junction being coupled to ground; and a P-type metal oxide semiconductor transistor, a source and a gate of the P-type metal oxide semiconductor transistor being coupled to an N-type side of a PN junction whose P-type side coupled to the ground, a drain of the P-type metal oxide semiconductor transistor coupled to the terminal.

Additional advantages and novel features of the invention will be set forth in part in the description that follows, and in part will become more apparent to those skilled in the art upon examination of the following or upon learning by practice of the invention.

DESCRIPTION OF EMBODIMENTS

In a chip on which a radio frequency (RF) module is implemented, a voltage that is generated by switching a current flowing through an inductance element, e.g., an inductor element, may be output to a pad via a capacitance element, e.g., a capacitor element. The voltage output from the pad may exceed the range of a power supply voltage of the chip. For example, when the ground voltage of the chip is 0 V and the power supply voltage is 3.3 V, an output voltage may be in the range of −5 V to +5 V. Because a current flows through a diode element, a diode-connected MOS transistor, or the like, an ESD protection circuit including the diode element, the diode-connected MOS transistor, or the like may not be used.

Figure 1:
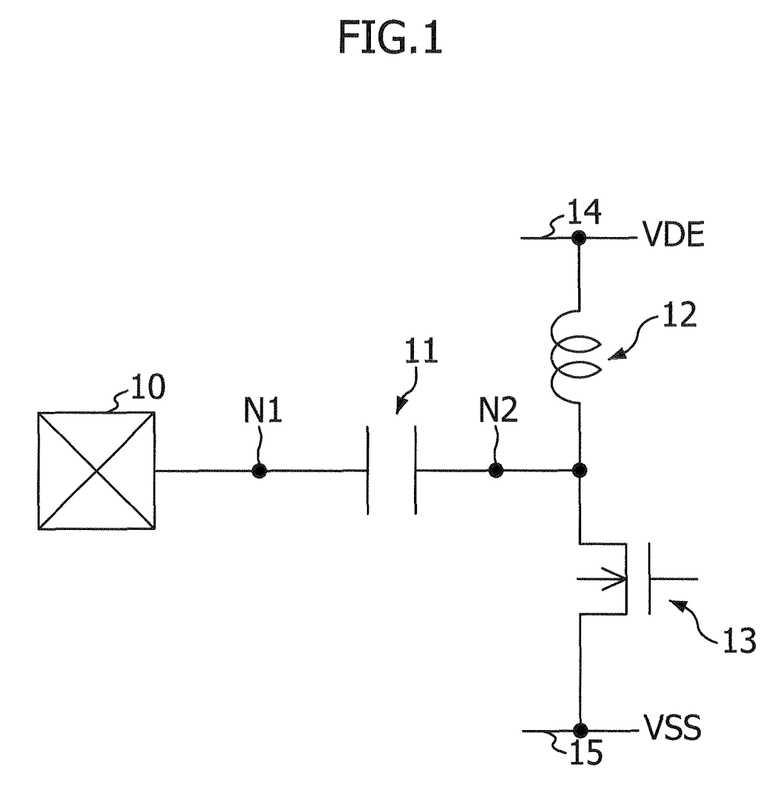
FIG. 1 illustrates an exemplary chip terminal.

FIG. 1 illustrates an exemplary circuit. The voltage of a signal that exceeds a power supply voltage may be applied to a chip terminal of the circuit illustrated in FIG. 1. The circuit illustrated in FIG. 1 includes a pad 10, a capacitance element 11, an inductor element 12, an N-type MOS (NMOS) transistor 13, a power supply line 14, and a ground line 15. The pad 10 is an external terminal, and a signal is transmitted from the pad 10 to the outside. An end N1, which is one of two ends of the capacitance element 11, is coupled to the pad 10. An end N2, which is the other end of the capacitance element 11, is coupled to a signal output circuit including the inductor element 12 and the NMOS transistor 13. The signal output circuit operates based on the power supply voltage between a first electric potential VDE and a second electric potential VSS. The electric potential VDE may be an electric potential on a positive side of the power supply voltage, and the electric potential VSS may be an electric potential on a negative side of the power supply voltage, e.g., on the ground voltage side. The power supply voltage VDE is supplied through the power supply line 14, and the ground voltage VSS is supplied through the ground line 15. The power supply voltage VDE may be, for example, 3.3 V, and the ground voltage VSS may be, for example, 0 V.

Figure 2:
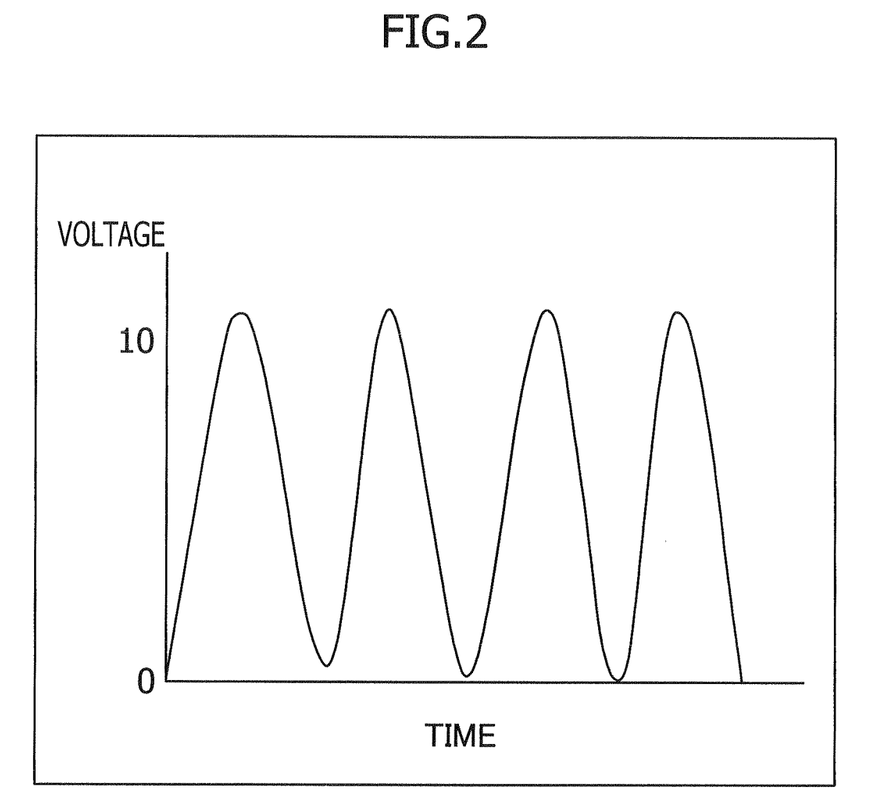
FIG. 2 illustrates an exemplary voltage waveform.
Figure 3:
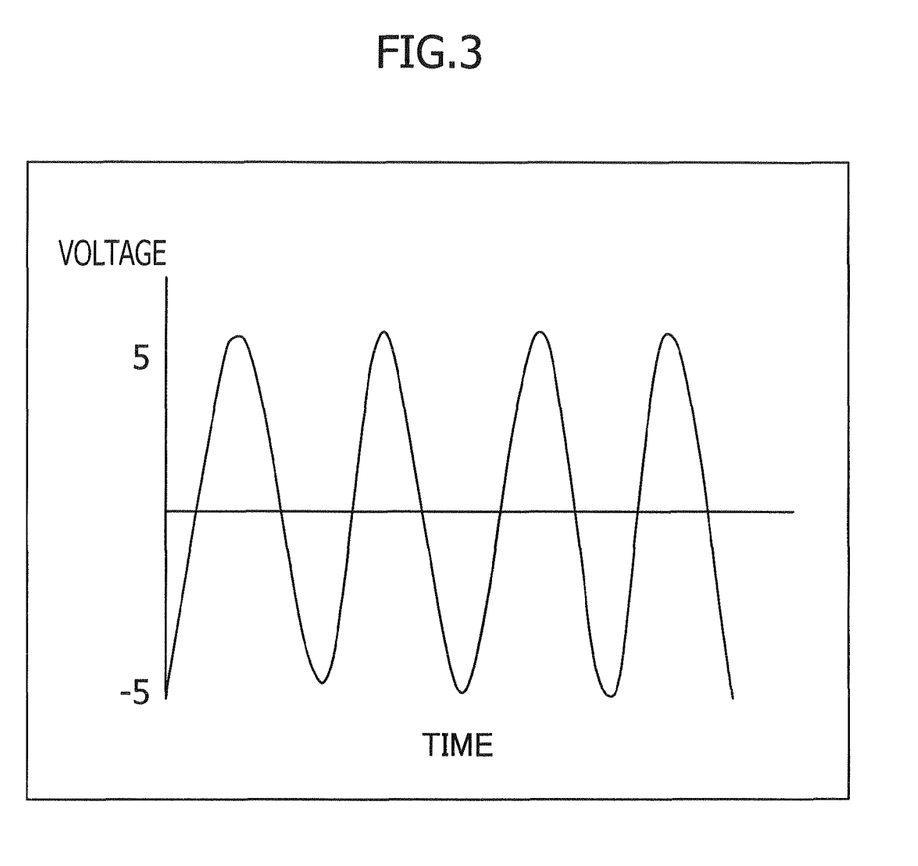
FIG. 3 illustrates an exemplary voltage waveform.

FIG. 2 illustrates an exemplary voltage waveform. The voltage waveform illustrated in FIG. 2 may indicate change in voltage at a node N2. FIG. 3 illustrates an exemplary voltage waveform. The voltage waveform illustrated in FIG. 3 may indicate change in voltage at a node N1. For example, in the signal output circuit illustrated in FIG. 1, when the on-resistance of the NMOS transistor 13 is reduced by increasing the gate voltage of the NMOS transistor 13, a current flowing through the NMOS transistor 13 is increased. Accordingly, a current flowing through the inductor element 12 is gradually increased. The change in the current may correspond to the difference between voltages between the ends of the inductor element 12. The voltage across the inductor element 12 may be generated in a direction where the current decreases, e.g., in a direction where the power supply line 14 side becomes the positive side of the voltage. The minimum value of the voltage at the node N2 may be equal to the ground voltage VSS supplied through the ground line 15, e.g., 0 V, as illustrated in FIG. 2. When a current flows through the inductor element 12, magnetic energy is stored in the inductor element 12 in accordance with the amount of the current and the inductance of the inductor element 12. When the on-resistance of the NMOS transistor 13 is increased by reducing the gate voltage of the NMOS transistor 13, the current flowing through the NMOS transistor 13 is decreased. Accordingly, the current flowing through the inductor element 12 is gradually decreased. The change in the current may correspond to the difference between voltages at the ends of the inductor element 12. The voltage across the inductor element 12 may be generated in a direction where the current increases due to release of the magnetic energy, e.g., in a direction where the node N2 side becomes the positive side of the voltage. The maximum value of the voltage at the node N2 may be a voltage higher than the power supply voltage VDE supplied through the power supply line 14, such as 3.3 V, e.g., 10 V, as illustrated in FIG. 2. After that, the magnetic energy continues to be released, the amount of decrease in the current decreases, and the voltage at the node N2 also decreases. A voltage having the voltage waveform illustrated in FIG. 2 is generated at the node N2. A voltage having the voltage waveform illustrated in FIG. 3, which is obtained by excluding direct current components from the voltage waveform illustrated in FIG. 2, e.g., a voltage having a voltage waveform that changes between −5 V and +5V, is generated at the node N1 that is capacitively coupled via the capacitance element 11 to the node N2.

For example, when the ground voltage VSS is 0 V, the power supply voltage VDE is 3.3 V and a signal to be output is, for example, in the range of −5 V to +5V, a diode element, a diode-connected MOS transistor, or the like may not be employed as an ESD protection circuit. When the voltage of the signal exceeds the power supply voltage VDE or becomes lower than the ground voltage VSS, the diode element, the diode-connected MOS transistor, or the like may become conductive so that a current may flow through the diode element, the diode-connected MOS transistor, or the like. For example, the voltage of a signal during a normal operation may cause the ESD protection circuit to become conductive.

Figure 4:
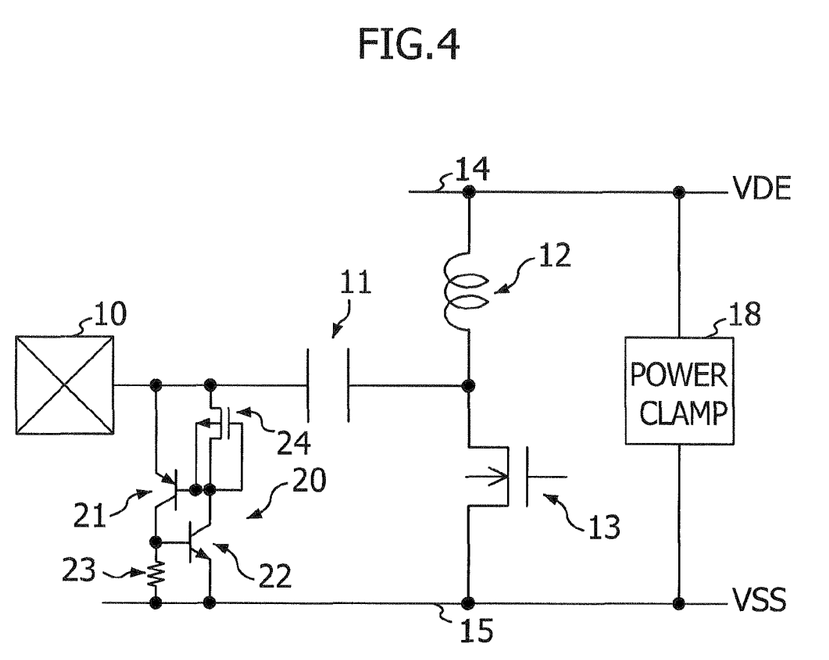
FIG. 4 illustrates an exemplary ESD protection circuit.

FIG. 4 illustrates an exemplary ESD protection circuit. The ESD protection circuit illustrated in FIG. 4 may be included in the circuit illustrated in FIG. 1. An ESD protection circuit 20 is provided between the pad 10 and the ground line 15. A power clamp 18 is provided between the power supply line 14 and the ground line 15.

The ESD protection circuit 20 includes a PNP-type transistor 21, an NPN-type transistor 22, a resistor 23, and a P-type MOS (PMOS) transistor 24. The base of the PNP-type transistor 21 is coupled to the collector of the NPN-type transistor 22. The collector of the PNP-type transistor 21 is coupled to the base of the NPN-type transistor 22. Accordingly, the PNP-type transistor 21 and the NPN-type transistor 22 have a thyristor structure, and have a PNPN junction where a P-type side corresponding to one end is coupled to the pad 10 and an N-type side corresponding to the other end is coupled to ground. A PNPN junction may be provided. FIG. 4 illustrates an equivalent circuit in which the PNP-type transistor 21 and the NPN-type transistor 22 are separated from each other. The PNP-type transistor 21 and the NPN-type transistor 22 may be separated from each other. Whether or not the PNP-type transistor 21 and the NPN-type transistor 22 are separated from each other may not matter. A resistance element may be provided between the collector of the PNP-type transistor 21 and the ground line 15. A well resistance provided between the PNP-type transistor 21 and the ground line 15 may be a resistor 23. The collector of the PNP-type transistor 21 is coupled to the ground line 15 via the resistor 23.

The source and gate of the PMOS transistor 24 are coupled to an N-type side of a PN junction where a P-type side is coupled to ground. The drain of the PMOS transistor 24 is coupled to the pad 10. The bulk of the PMOS transistor may be coupled to the source thereof. Referring to FIG. 4, a PN junction between the base and collector of the PNP-type transistor 21 is used as the PN junction. The P-type side of the PN junction (the collector of the PNP-type transistor 21) is coupled to ground via the resistor 23.

Figure 5:
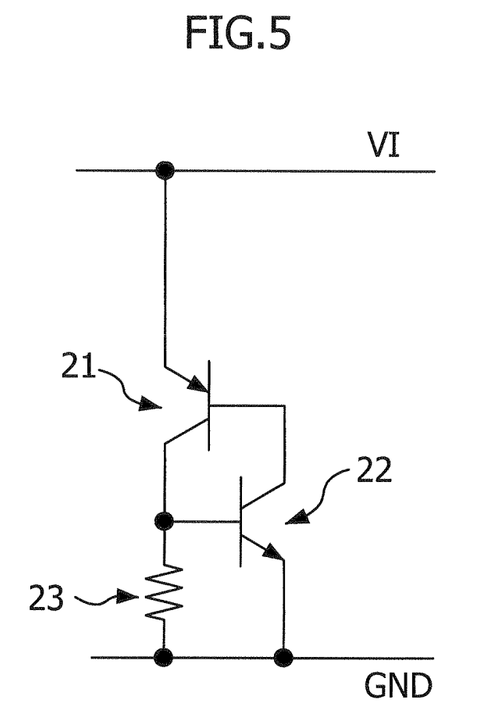
FIG. 5 illustrates an exemplary transistor circuit.
Figure 6:
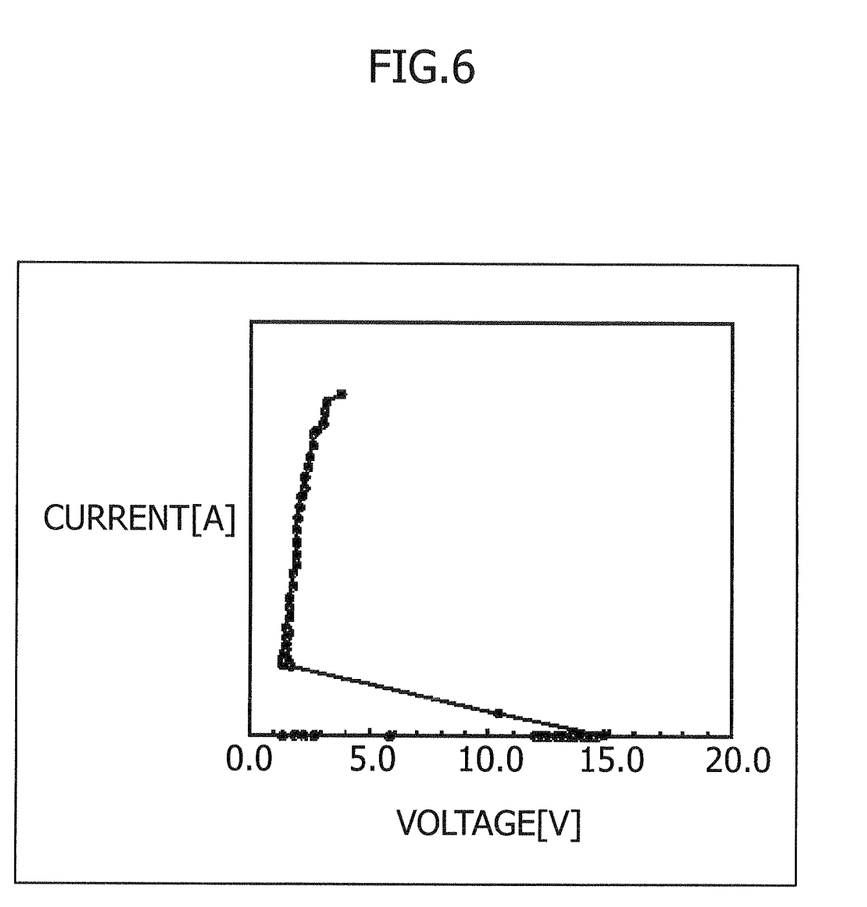
FIG. 6 illustrates exemplary characteristics of a transistor circuit.

FIG. 5 illustrates an exemplary transistor circuit. Referring to FIG. 5, a voltage may be applied to the PNPN junction corresponding to the PNP-type transistor 21 and the NPN-type transistor 22. FIG. 6 illustrates exemplary characteristics of a transistor circuit. The characteristics illustrated in FIG. 6 may be the characteristic of the transistor circuit illustrated in FIG. 5. The transistor circuit illustrated in FIG. 5 may correspond to a portion of the ESD protection circuit 20 excluding the PMOS transistor 24, e.g., the PNP-type transistor 21, the NPN-type transistor 22, and the resistor 23. FIG. 6 illustrates relationships between a voltage VI and a current flowing through the emitter of the PNP-type transistor 21 when the voltage VI is applied to the emitter side of the PNP-type transistor 21 of the transistor circuit.

The characteristics illustrated in FIG. 6 may be the operating characteristics of a thyristor having no trigger. When the voltage VI is in the range of −5 V to +5 V, current may not flow through the transistor circuit illustrated in FIG. 5. When the voltage VI increases and reaches about 15 V, breakdown occurs between the collector and base of the PNP-type transistor 21, and a current starts flowing from the emitter via the base to the collector of the PNP-type transistor 21. Breakdown may correspond to the characteristics in which a current suddenly flows from a point at which the voltage represented by the horizontal axis illustrated in FIG. 6 reaches 15 V. When the current becomes about 0.8 mA, the NPN-type transistor 22 is turned on, and a current flows from the emitter of the PNP-type transistor 21 via the base of the PNP-type transistor 21 and the NPN-type transistor 22, which is in an on-state, to GND. Accordingly, because the current also flows through the base of the PNP-type transistor 21, the PNP-type transistor 21 enters an on-state, and a current flows via the PNP-type transistor 21, which is in the on-state, to GND. When a static voltage that exceeds +15 V is applied to the pad 10 illustrated in FIG. 4, the PNP-type transistor 21, the NPN-type transistor 22, and the resistor 23 of the ESD protection circuit 20 provide a path along which a current is caused to flow from the pad 10 to ground. Because static energy is released, the capacitance element 11 illustrated in FIG. 4 may avoid damage.

Figure 7:
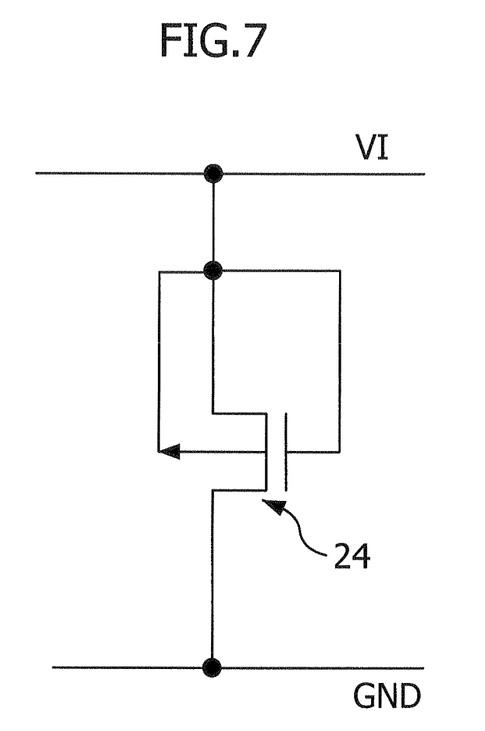
FIG. 7 illustrates an exemplary transistor circuit.
Figure 8:
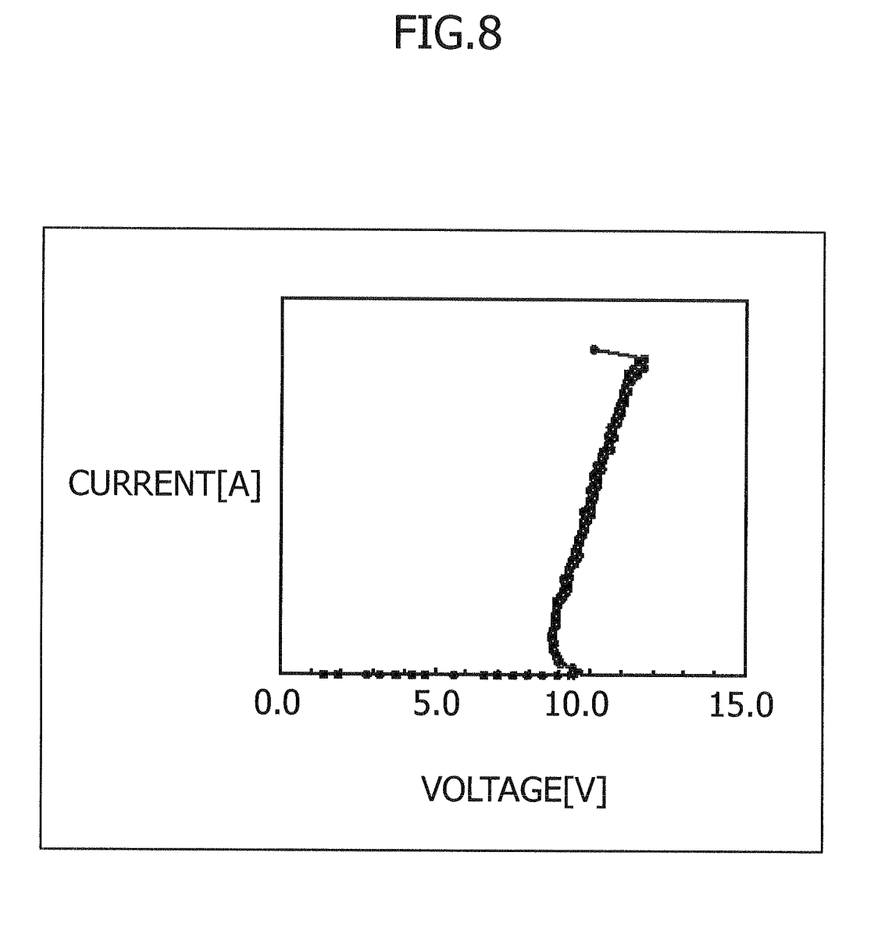
FIG. 8 illustrates exemplary characteristics of a transistor circuit.

FIG. 7 illustrates an exemplary transistor circuit. Referring to FIG. 7, a voltage may be applied to the PMOS transistor 24. FIG. 8 illustrates exemplary characteristics of a transistor circuit. The characteristics illustrated in FIG. 8 may be the characteristics of the transistor circuit illustrated in FIG. 7. The transistor circuit illustrated in FIG. 7 may correspond to the PMOS transistor 24 of the ESD protection circuit 20 illustrated in FIG. 4. FIG. 8 illustrates relationships between the voltage VI and a current flowing from the source to the drain of the PMOS transistor 24 when the voltage VI is applied to the source side of the PMOS transistor 24, e.g., an end of a channel that is coupled to the gate and bulk of the PMOS transistor 24.

When the voltage VI increases and reaches about 10 V, breakdown occurs between the drain of the PMOS transistor 24 and an N-well. Accordingly, a voltage drop occurs in the N-well, which is coupled to the source side, in accordance with a current flowing through the N-well during breakdown between the N-well and the drain and the well resistance of the N well. When the voltage drop exceeds a conduction threshold of the base (the N-well) and the emitter (the source), a PNP-type parasitic transistor becomes conductive, and a current flows between the source (the emitter) and the drain (the collector) of the PMOS transistor 24. The breakdown and the conduction of the parasitic transistor may correspond to the characteristics in which a current suddenly flows from a point at which the voltage represented by the horizontal axis illustrated in FIG. 8 reaches 10 V.

In the PMOS transistor 24 illustrated in FIG. 7, when the voltage VI on the source side, e.g., the voltage VI at the end of the channel coupled to the gate and bulk, becomes lower than the ground voltage GND, the PMOS transistor 24 may become conductive and a current may flow through the PMOS transistor 24. The source and gate of the PMOS transistor 24 of the ESD protection circuit 20 illustrated in FIG. 4 are coupled to an N-type side of the PN junction where a P-type side is connected to ground. The PMOS transistor 24 is coupled in series to a diode having a forward direction from the VSS to the voltage of a signal. Thus, even when the voltage of a signal changes in the range of −5 V to +5V, no current may flow through the PMOS transistor 24. When a negative static voltage that exceeds the threshold voltage of the diode, e.g., the sum of about 0.6 V and about 10 V, is applied to the pad 10 illustrated in FIG. 4, the series connection between the diode and the PMOS transistor 24 provides a path along which a current is caused to flow from the ground line 15 to the pad 10. Because static energy is released, the capacitance element 11 illustrated in FIG. 4 may not be damaged. A current flows from the power supply line 14 to the ground line 15 via the power clamp 18, which couples between the power supply line 14 and the ground line 15, and flows to the pad 10 via the PMOS transistor 24. The power clamp 18 may include NMOS transistors having a large size, e.g., a large gate width, or the like.

As illustrated in FIGS. 5 to 8, since the ESD protection circuit 20 illustrated in FIG. 4 does not become conductive and current does not flow through the ESD protection circuit 20 when the voltage of a signal to be output to the pad 10 varies in the range of −5 V to +5 V, the signal is appropriately output. Since a current flows through the PNPN junction as illustrated in FIGS. 5 and 6 when a positive static voltage is applied to the pad 10, an ESD protection operation is performed. As a current flows through the PMOS transistor 24 as illustrated in FIGS. 7 and 8 when a negative static voltage is applied to the pad 10, an ESD protection operation is performed. In the transistor circuit illustrated in FIG. 4, a signal is output to the pad 10. When the signal is output via the pad 10, the ESD protection circuit 20 performs an ESD protection operation.

The PNP-type transistor 21, the NPN-type transistor 22, and the PMOS transistor 24 may be elements that are disposed along a discharge path, and may have a size for causing an ESD current to flow, e.g., a size for causing an ESD current of approximately 3 A to flow. The resistor 23 may have a large resistance value so that the resistor 23 serves as a trigger of the thyristor structure including the PNP-type transistor 21 and the NPN-type transistor 22 to enhance the on-state of the thyristor. A W value of the anode and cathode of the thyristor may be approximately in the range of 60 μm to 100 μm. A total W value of the PMOS transistor 24 may be approximately in the range of 500 μm to 1000 μm. The resistance value of the resistor 23 may be approximately 1 kΩ.

Figure 9:
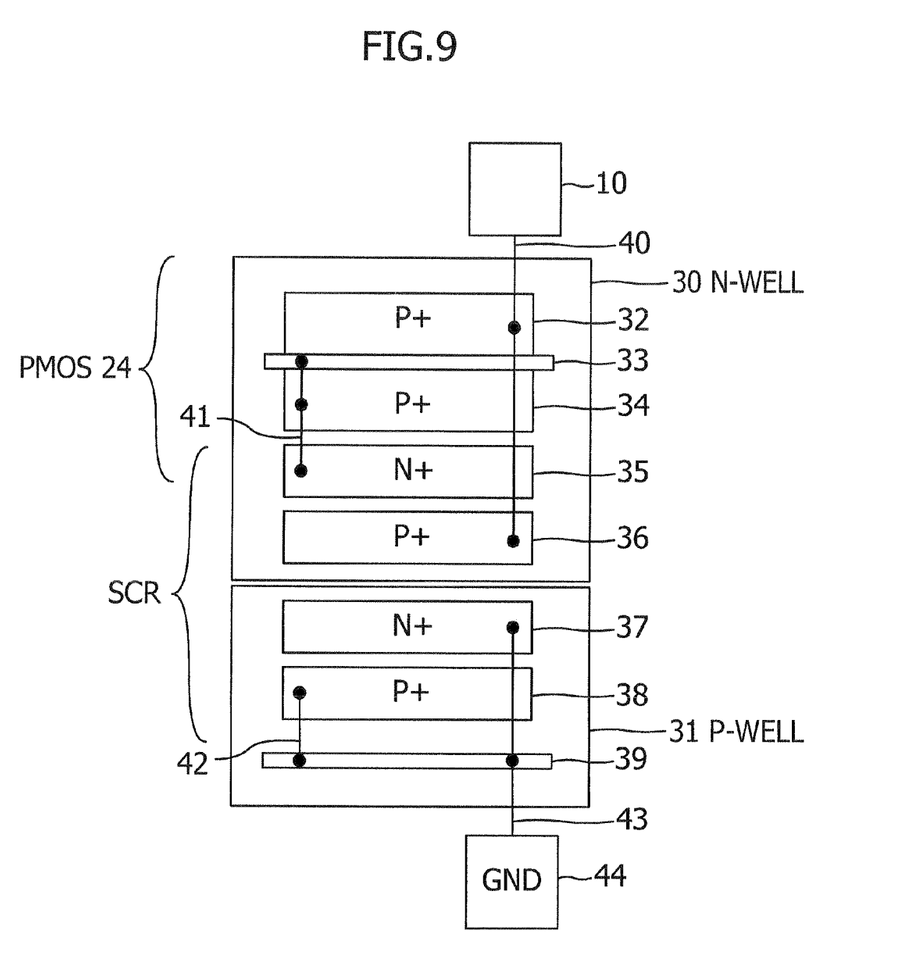
FIG. 9 illustrates an exemplary layout of a semiconductor device.
Figure 10:
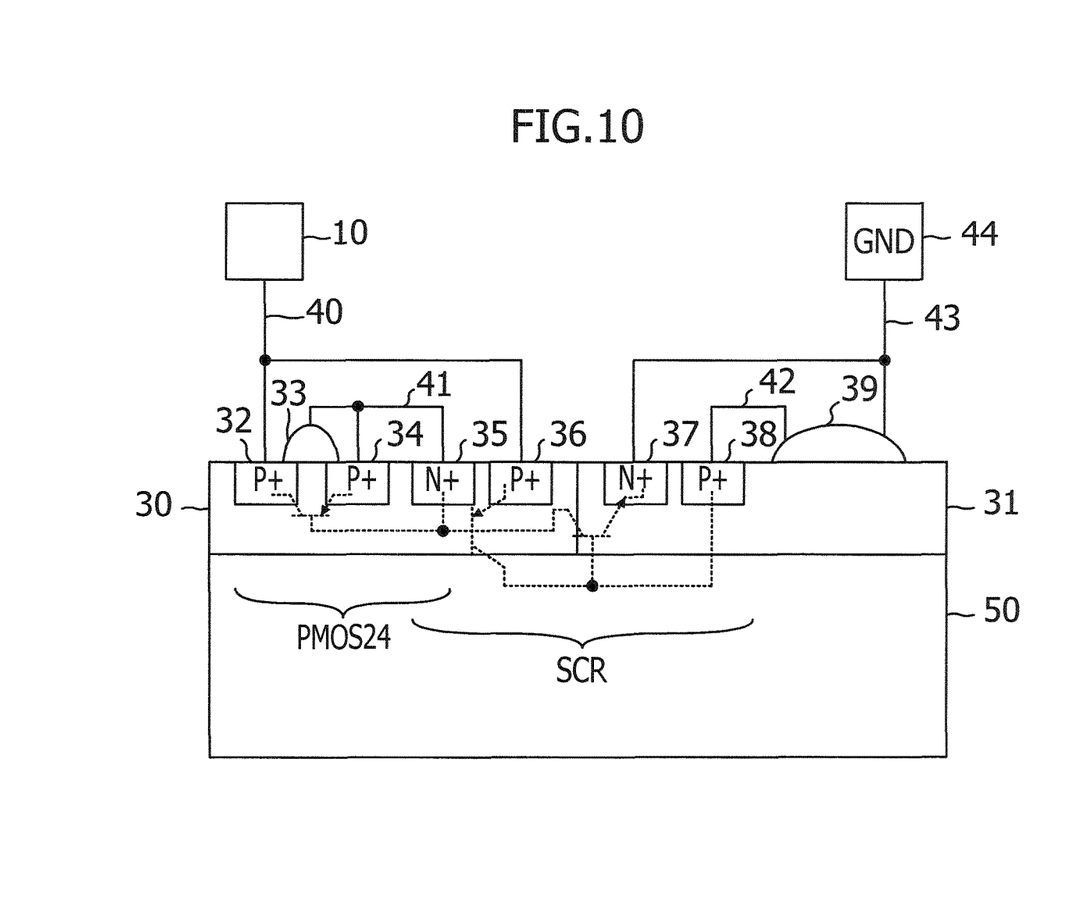
FIG. 10 illustrates an exemplary cross-section of a semiconductor device.

FIG. 9 illustrates an exemplary layout of a semiconductor device. The semiconductor device may include the ESD protection circuit 20. FIG. 10 illustrates an exemplary cross-section of a semiconductor device. The semiconductor device may include the ESD protection circuit 20. In FIGS. 9 and 10, elements that may be substantially the same as or similar to the elements illustrated in FIG. 4 are denoted by the same numeral references. An insulating film and so forth may be omitted. The ESD protection circuit 20 is formed in an N-well 30 and a P-well 31 that are formed in a P-type semiconductor substrate 50. In the N-well 30, P-type diffusion regions 32, 34, and 36 that are p+ diffusion regions and an N-type diffusion region 35 that is an N+ diffusion region are formed. In the P-well 31, an N-type diffusion region 37 that is an N+ diffusion region and a P-type diffusion region 38 that is a P+ diffusion region are formed.

The P-type diffusion regions 32 and 36 formed in the N-well 30 are coupled to the pad 10 via a wiring line 40 including contact holes, via holes, metallic wiring lines, and so forth. In a normal operation, for example, a voltage of a signal, for example, a voltage in the range of −5 V to +5 V may be applied to the pad 10. A gate 33 including polysilicon is formed on the top of a region between the P-type diffusion regions 32 and 34 in order to form a PMOS transistor. The gate 33 of the PMOS transistor 24 is coupled to the P-type diffusion region 34, which serves as the source of the PMOS transistor 24, and the N-type diffusion region 35 via a wiring line 41 including contact holes, via holes, metallic wiring lines, and so forth. The N-type diffusion region 35 may correspond to the bulk of the PMOS transistor 24.

The N-type diffusion region 37 formed in the P-well 31 is coupled to a ground terminal pad 44 to which the ground voltage is applied via a wiring line 43 including contact holes, via holes, metallic wiring lines, and so forth. The P-type diffusion region 38 is coupled to one end of a resistance element 39 including polysilicon via a wiring line 42 including contact holes, via holes, metallic wiring lines, and so forth. The other end of the resistance element 39 is coupled to the wiring line 43. The resistor 23 illustrated in FIG. 4 may include the well resistance of the P-well 31 and the resistance element 39.

A dotted line illustrated in FIG. 10 indicates the relationships between the PMOS transistor 24, the PNP-type transistor 21, and the NPN-type transistor 22 which include the ESD protection circuit 20, and semiconductor regions. In FIGS. 9 and 10, a portion denoted by SCR may correspond to a thyristor (a silicon controlled rectifier) including the PNP-type transistor 21 and the NPN-type transistor 22. The emitter, base, and collector of the PNP-type transistor 21 may correspond to the P-type diffusion region 36, the N-well 30, and the P-type semiconductor substrate 50 or the P-well 31, respectively. The emitter, base, and collector of the NPN-type transistor 22 may correspond to the N-type diffusion region 37, the P-well 31, and the N-well 30, respectively. The P-type diffusion regions 32 and 34 may correspond to the drain and source of the PMOS transistor 24, respectively. The PNPN junction of the thyristor structure may include the P-type diffusion region 36, the N-well 30, the P-well 31, and the N-type diffusion region 37. The PN junction that is coupled to the PMOS transistor 24 may correspond to a junction between a P-type side of the P-well 31 and an N-type side of the N-well 30.

Figure 11:
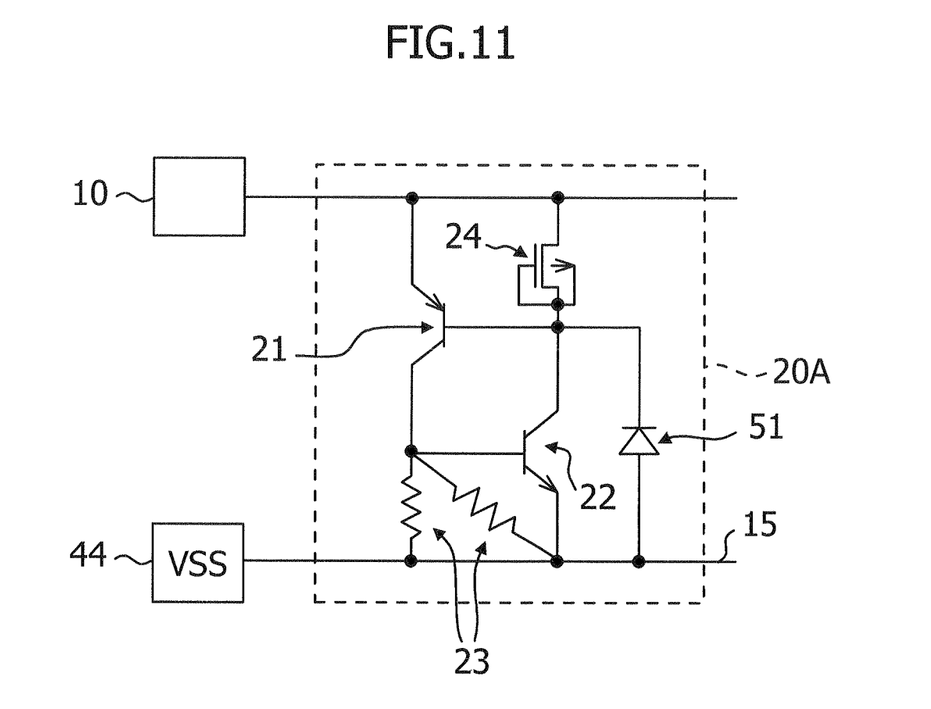
FIG. 11 illustrates an exemplary ESD protection circuit.

FIG. 11 illustrates an exemplary ESD protection circuit. In FIG. 11, elements that may be substantially the same as or similar to the elements illustrated in FIG. 4 are denoted by the same numeral references, and a description thereof may be omitted or reduced. An ESD protection circuit 20A illustrated in FIG. 11 includes a diode 51 having a cathode coupled to the source of the PMOS transistor 24 and an anode coupled to the ground line 15. The resistor 23 of the ESD protection circuit 20A may include both a well resistance and a resistance element.

Because the diode 51 is provided as an element that is different from the PNPN junction having a thyristor structure as illustrated in FIG. 11, the amount of current flowing from the ground line 15 to the pad 10 may increase in an ESD protection operation.

Figure 12:
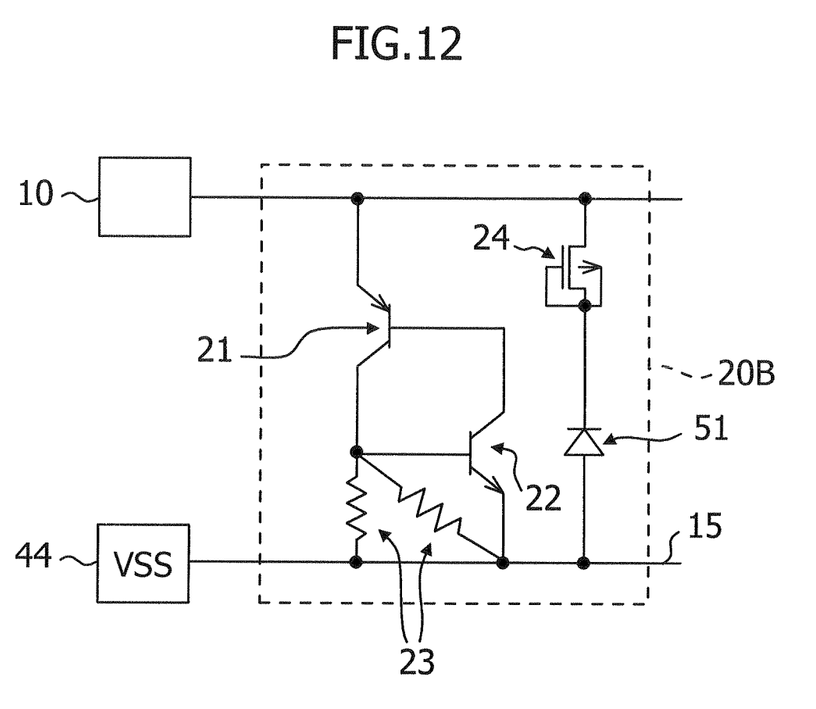
FIG. 12 illustrates an exemplary ESD protection circuit.

FIG. 12 illustrates an exemplary ESD protection circuit. In FIG. 12, elements that may be substantially the same as or similar to the elements illustrated in FIGS. 4 and 11 are denoted by the same numeral references, and a description thereof may be omitted or reduced. In an ESD protection circuit 20B illustrated in FIG. 12, a PN junction that is coupled in series to the PMOS transistor 24 is disposed as the diode 51 that is different from the PNPN junction having a thyristor structure. For example, referring to FIG. 12, the PNPN junction including the PNP-type transistor 21 and the NPN-type transistor 22 may not be directly coupled to the PMOS transistor 24. The ESD protection circuit 20B illustrated in FIG. 12 may provide functions that are substantially the same as or similar to the functions of the ESD protection circuit 20 illustrated in FIG. 4 or the functions of the ESD protection circuit 20A illustrated in FIG. 11. Because the diode 51 is provided as an element that is different from the PNPN junction having a thyristor structure as illustrated in FIG. 12, the amount of current flowing from the ground line 15 to the pad 10 may increase. Accordingly, the elements may avoid damage.

Figure 13:
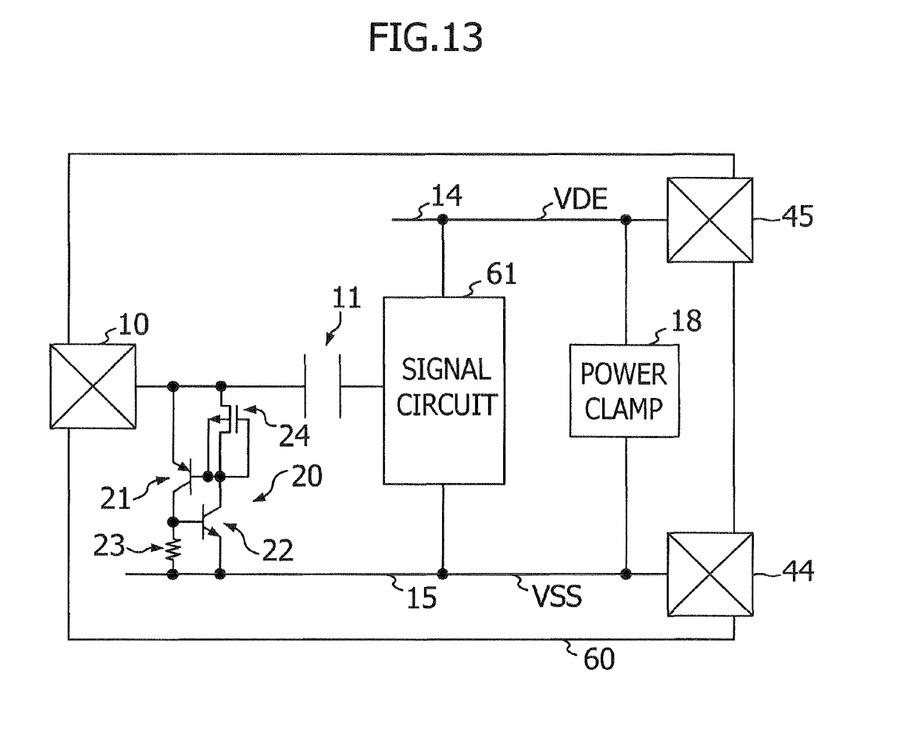
FIG. 13 illustrates an exemplary semiconductor chip.

FIG. 13 illustrates an exemplary semiconductor chip. The semiconductor chip illustrated in FIG. 13 may include the above-described ESD protection circuit 20. In FIG. 13, elements that may be substantially the same as or similar to the elements illustrated in FIG. 4 are denoted by the same numeral references, and a description thereof may be omitted or reduced. A semiconductor chip 60 illustrated in FIG. 13 includes the capacitance element 11, the power supply line 14, the ground line 15, the power clamp 18, the ESD protection circuit 20, and a signal circuit 61. The signal circuit 61 outputs a signal to the pad 10 via the capacitance element 11, and a signal is input from the pad 10 to the signal circuit 61. The signal circuit 61 is driven based on the power supply voltage VDE, which is supplied through the power supply line 14, and the ground voltage VSS, which is supplied through the ground line 15. The power supply voltage VDE may be for example, 3.3 V, and the ground voltage VSS may be, for example, 0 V. The voltage of a signal that is supplied to the pad 10 may vary, for example, in the range of −5 V to +5 V. The power supply line 14 is coupled to a pad 45 serving as a power supply terminal, and receives the power supply voltage VDE from the outside. The ground line 15 is coupled to the pad 44 serving as a ground terminal, and receives the ground voltage VSS from the outside.

The ESD protection circuit 20 provides appropriate ESD protection for the pad 10. When a negative static voltage is applied to the pad 10, a current flows from the power supply line 14 to the pad 10 via the power clamp 18, the ground line 15, and the ESD protection circuit 20.

Exemplary aspects in accordance with the present invention have now been described in accordance with the above advantages. It will be appreciated that these examples are merely illustrative of the invention. Many variations and modifications will be apparent to those skilled in the art.

The invention claimed is:

1. An electro-static discharge protection circuit, comprising:
    a PNPN junction, a P-type side of the PNPN junction being coupled to a terminal, an N-type side of the PNPN junction being coupled to ground; and
    a P-type metal oxide semiconductor transistor, a source and a gate of the P-type metal oxide semiconductor transistor being coupled to an N-type side of a PN junction whose P-type side is coupled to ground and which is one of PN junctions included in the PNPN junction, a drain of the P-type metal oxide semiconductor transistor being coupled to the terminal.

2. The electro-static discharge protection circuit according to claim 1, wherein the PN junction is included in the PNPN junction.

3. The electro-static discharge protection circuit according to claim 1, wherein a bulk of the P-type metal oxide semiconductor transistor is coupled to the source of the P-type metal oxide semiconductor transistor.

4. The electro-static discharge protection circuit according to claim 1, further comprising:
    a resistance element disposed between the ground and a P-type gate of a thyristor structure including the PNPN junction.

5. The electro-static discharge protection circuit according to claim 1, further comprising a diode, a cathode of the diode being coupled to the source of the P-type metal oxide semiconductor transistor, an anode of the diode being coupled to the ground.

6. The electro-static discharge protection circuit according to claim 1, wherein a diode included in the PN junction is different from a diode included in the PNPN junction.

7. The electro-static discharge protection circuit according to claim 1, wherein the P-type side of the PNPN junction is coupled directly to the terminal and the N-type side of the PNPN junction is coupled directly to ground.

8. The electro-static discharge protection circuit according to claim 1, wherein the N-type side of the PN junction is shared with the N-type side of the P-type metal oxide semiconductor transistor.

9. A semiconductor device comprising:
    a terminal;
    a capacitance element, one end of the capacitance element being coupled to the terminal;
    a signal circuit coupled to the other end of the capacitance element and disposed between a first power supply line and a second power supply line;
    a power clamp disposed between the first power supply line and the second power supply line;
    a PNPN junction, a P-type side of the PNPN junction being coupled to the terminal, an N-type side of PNPN junction being coupled to ground; and
    a P-type metal oxide semiconductor transistor, a source and a gate of the P-type metal oxide semiconductor transistor being coupled to an N-type side of a PN junction whose P-type side is coupled to the ground and which is one of PN junctions included in the PNPN junction, a drain of the P-type metal oxide semiconductor transistor being coupled to the terminal.

10. The semiconductor device according to claim 9, wherein the PN junction is included in the PNPN junction.

11. The semiconductor device according to claim 9, wherein a bulk of the P-type metal oxide semiconductor transistor is coupled to the source of the P-type metal oxide semiconductor transistor.

12. The semiconductor device according to claim 9, further comprising:
    a resistance element disposed between the ground and a P-type gate of a thyristor structure including the PNPN junction.

13. The semiconductor device according to claim 9, further comprising a diode, wherein a cathode of the diode being coupled to the source of the P-type metal oxide semiconductor transistor, an anode of the diode being coupled to the ground.

14. The semiconductor device according to claim 9, wherein a diode included in the PN junction is different from a diode included in the PNPN junction.

15. The semiconductor device according to claim 9, wherein the P-type side of the PNPN junction is coupled directly to the terminal and the N-type side of the PNPN junction is coupled directly to ground.

16. The semiconductor device according to claim 9, wherein the N-type side of the PN junction is shared with the N-type side of the P-type metal oxide semiconductor transistor.

* * * * *